US006730456B2

(12) United States Patent
Takahashi et al.

(10) Patent No.: US 6,730,456 B2
(45) **Date of Patent: *May 4, 2004**

(54) PLANOGRAPHIC PRINTING PLATE PRECURSOR

(75) Inventors: Miki Takahashi, Shizuoka-ken (JP); Koichi Kawamura, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/118,051

(22) Filed: Apr. 9, 2002

(65) Prior Publication Data

US 2003/0035936 A1 Feb. 20, 2003

(30) Foreign Application Priority Data

Apr. 9, 2001 (JP) ....................................... 2001-110495
May 14, 2001 (JP) ....................................... 2001-143893

(51) Int. Cl.[7] .................................................... G03F 7/11

(52) U.S. Cl. ................. 430/271.1; 430/138; 430/281.1; 101/453

(58) Field of Search .............................. 430/138, 270.1, 430/271.1, 281.1, 286.1, 287.1, 288.1, 302, 348, 944, 945, 964; 101/453, 463.1, 465, 466, 467

(56) References Cited

U.S. PATENT DOCUMENTS 6,153,352 A * 11/2000 Oohashi et al. .......... 430/270.1
6,162,578 A * 12/2000 Zheng et al. ............ 430/270.1
6,242,155 B1 * 6/2001 Yamasaki et al. ........ 430/270.1
2002/0023565 A1 * 2/2002 Kawamura et al. ......... 101/453

FOREIGN PATENT DOCUMENTS

EP 652 483 A1 * 5/1995 ........... G03F/7/004

OTHER PUBLICATIONS

Hackh's Chemical Dictionary, 3rd Ed., N.Y., McGraw–Hill Book Company, Inc., 1944. p. 504.*

* cited by examiner

*Primary Examiner*—Mark F. Huff
*Assistant Examiner*—Barbara Gilliam
(74) *Attorney, Agent, or Firm*—Burns, Doane, Swecker & Mathis, L.L.P.

(57) ABSTRACT

A planographic printing plate precursor comprising a support and a cross-linking hydrophilic layer disposed thereon, which cross-linking hydrophilic layer has a cross-linking structure and includes a hydrophilic high molecular compound having a hydrophilic graft chain. The planographic printing plate precursor is characterized by the cross-linking hydrophilic layer being produced by reacting a hydrophilic high molecular compound having, on the backbone polymer thereof, a group which is able to react with a cross-linking agent, with the cross-linking agent. In the present invention, an image forming layer may be provided on the cross-linking hydrophilic layer. The cross-linked hydrophilic layer may include a compound which is able to form a hydrophobic surface region of the cross-linking hydrophilic layer when exposed to heat or radiation.

16 Claims, No Drawings

PLANOGRAPHIC PRINTING PLATE PRECURSOR

BACKGROUND OF THE INVENTION

1. Field of the Invention

The present invention relates to a novel planographic printing plate precursor. More specifically, the present invention relates to a planographic printing plate precursor on which an image can be scan-exposed using a laser and based on digital signals, and which is excellent in sensitivity and blemish-resistant.

2. Description of the Related Art

Planographic printing uses a printing plate which includes a oleophilic region to receive ink and an ink-repellent (i.e., hydrophilic) region to receive moistening water. Photosensitive planographic printing plate precursors ("PS plates") are now generally used for planographic printing.

A PS plate, which comprises a support made of aluminum, for example, and a photosensitive layer provided on the support has become practical and is widely used. This PS plate is used for printing by: image exposing and developing the PS plate to remove the photosensitive layer at non-image portions, and printing using the hydrophilic property of the support surface and the oleophilic property of the photosensitive layer. Accordingly, the support surface of the PS plate must have a good hydrophilic property to prevent blemishes in non-image portions.

Conventionally, an anodized aluminum support is used as a hydrophilic support or a hydrophilic layer for a planographic printing plate; this support is generally silicate treated to further increase the hydrophilic property thereof. The hydrophilic support and hydrophilic layer using this aluminum support are now being intensively studied. For example, a support undercoated with polyvinyl sulfonic acid is disclosed in Japanese Patent Application Laid-Open (JP-A) No. 7-1853, and use of a polymer which has a sulfonic acid group as an undercoat of a photosensitive layer is disclosed in JP-A No. 59-101651. Use of a polyvinyl benzonic acid as an undercoat has also been proposed.

Instead of metals such as aluminum, flexible supports such as polyethylene terephthalate (PET) and cellulose acetate, may be used as the support. In this case, many techniques have been proposed to form a hydrophilic layer. Examples thereof include the following: a swollen hydrophilic layer, which comprises a hydrophilic polymer and a hydrophobic polymer, disclosed in JP-A No. 8-292558; a PET support which has a microporous hydrophilic cross-linked silicate surface, disclosed in EP 0709228; and a hydrophilic layer which contains a hydrophilic polymer and is cured by using hydrolyzed tetraalkylorthosilicate, disclosed in JP-A Nos. 8-272087 and 8-507727.

These hydrophilic layers provide printing plates that exhibit a hydrophilic property, which is improved over the prior art, and produce unblemished printing matter when printing is initiated. However, these hydrophilic layers have problems such as the hydrophilic layer peeling off from the support after repeated printing, and the hydrophilic property deteriorating over time. Accordingly, there is a demand for a planographic printing plate precursor, which is able to print many sheets with no blemishes and whose hydrophilic layer does not peel off from the support causing the hydrophilic property of the support surface to deteriorate, under even more severe printing conditions. Further, from the viewpoint of utility, there is a demand for an even more improved hydrophilic property.

Moreover, a printing plate for use in a computer-to-plate system, for which recent developments have been remarkable, has been widely studied. To promote even more streamlining of processes and to solve problems involving disposal of waste liquids, a planographic printing plate precursor, which can be mounted on a printing machine for printing directly after exposure, i.e., without undergoing development, has been studied and various methods using the same have been proposed.

One of these methods is known as an on-machine developing, which is carried out in the following manner. An exposed printing plate precursor is mounted on a cylinder of a printing machine. Moistening water and ink are applied to the printing plate precursor while the cylinder is rotated to remove the non-image portion of the printing plate precursor. In this method, since the printing plate precursor is exposed and then printed on a printing machine, the processing is completed during printing.

To be suitable for use in the on-machine developing, the planographic printing plate must have a photosensitive layer that is soluble in moistening water or an ink solvent, and must be able to be handled in daylight so that it can be developed in a printing machine in a bright room.

WO 94/23954 discloses a printing plate which needs no developing. This printing plate includes a support and a cross-linking hydrophilic layer provided on the support. The cross-linking hydrophilic layer has a heat-fusing substance encapsulated in micro-capsules. In this printing plate, due to heat generated in an area exposed by laser, the micro-capsules break and oleophilic substances are eluted from within, whereby the surface of the hydrophilic layer is made hydrophobic. Although this printing plate precursor requires no developing, it has a problem in that blemishes increase in the non-image portion after repeated printing.

SUMMARY OF THE INVENTION

The present invention is intended to overcome the above-described conventional drawbacks and to achieve the following objects. An object of the present invention is to provide a positive- or negative-type planographic printing plate precursor which has an improved blemish-resistance and with which much unblemished printed matter can be printed even under severe printing conditions, by disposing thereon a hydrophilic layer having superior persistence and high hydrophilic property.

Another object of the present invention is to provide a planographic printing plate precursor which can be made, after an image is formed thereon, by scan-exposure based on digital signals, and either a simple developing operation using water, or by remaining mounted to a printing machine and print without being specially developed.

The present inventors, as a result of intensive studies, have found that the conventional problems can be solved by introducing a hydrophilic graft chain into the cross-linking hydrophilic layer and forming a negative- or positive-type image forming layer on the cross-linking hydrophilic layer, and accomplished the present invention.

A planographic printing plate precursor of the present invention comprises a support and a cross-linking hydrophilic layer disposed thereon, which cross-linking hydrophilic layer has a cross-linking structure and includes a hydrophilic high molecular compound having a hydrophilic graft chain. The planographic printing plate precursor of the present invention is characterized in that the cross-linking hydrophilic layer is produced by reacting a hydrophilic high molecular compound having, on the backbone polymer thereof, a group which is able to react with a cross-linking agent, with the cross-linking agent.

It is preferable to provide an image forming layer on the cross-linking hydrophilic layer. A preferable image forming layer includes a high molecular compound having a functional group whose polarity changes between hydrophilic and hydrophobic due to acid, heat or exposure to radiation, and forms an image by using the change between the hydrophobic property and hydrophilic property of the surface thereof. The cross-linking hydrophilic layer preferably further includes a compound which is able to form a hydrophobic area on the surface of the cross-linking hydrophilic layer when exposed to heat or radiation.

Regarding the effects of the present invention, the present inventors have the following assumptions. The cross-linked hydrophilic layer has a cross-linking structure formed by a hydrophilic high molecular compound having, on the backbone thereof, a group which is able to react with a cross-linking agent, which high molecular compound being made to react with a cross-linking agent. The tight cross-linking structure imparts, to the cross-linking hydrophilic layer, an excellent hydrophilic property and good ability to withstand repeated printing. Further, the hydrophilic graft chain is introduced into the hydrophilic high molecular compound, and a hydrophilic functional group exists in a form of graft chain which is able to move freely. Therefore, the moistening water can be supplied and removed speedily. The excellent hydrophilic property may effectively suppress blemishes in the non-image portion.

In a preferred embodiment, the present invention may comprise an image forming layer (i.e., a recording layer) provided on the cross-linked hydrophilic layer. The image forming layer includes a high molecular compound, which has a polarity exchanging group at a side chain thereof, whose polarity changes from one of hydrophilic and hydrophobic to the other, by exposure to at least one of acid, heat and exposure to radiation (hereinafter, "polarity exchanging group"). In this embodiment, the image can be scan-exposed with a laser, for example, in a short time. In this image forming method, because the image portion and the non-image portion are formed by exchanging the polarity of the surface, on-machine developing can be achieved by making a plate through a simple developing of a printing plate precursor by using water, or by making a plate by mounting a printing plate precursor on a printing machine for printing without undergoing developing.

The polarity exchanging group of the high molecular compound used in the image forming layer includes two types of functional groups: a functional group whose polarity changes from hydrophobic to hydrophilic; and a functional group whose polarity changes from hydrophilic to hydrophobic. The present invention also has an advantage of providing both positive- and negative-type planographic printing plates, in the same layer configuration, by selectively employing the high molecular compound having the polarity exchanging group.

In a preferred embodiment of the present invention, the cross-linked hydrophilic layer may include, in a matrix composed of a hydrophilic high molecular compound, a compound, such as a heat-fusing hydrophobic particle, which is able to form a hydrophobic area on the surface of the cross-linked hydrophilic layer. In this embodiment, the heat-fusing hydrophobic particles fuse and coalesce when exposed to heat or radiation to form a hydrophobic area, whereby an image can be formed by scan-exposure with a laser, or the like, in a short time. Accordingly, the cross-linking hydrophilic layer works as the image forming layer. Further, the non-image portion has a good hydrophilic property because of the tightly cross-linking hydrophilic layer, on-machine developing can be achieved by making a plate through a simple developing of a printing plate precursor by using water, or by making a plate by mounting a printing plate precursor on a printing machine for printing without undergoing developing.

DETAILED DESCRIPTION OF THE PREFERRED EMBODIMENTS

Hereinafter, the planographic printing plate precursor of the present invention will be described in detail.

The planographic printing plate precursor of the present invention comprises a support and a cross-linking hydrophilic layer provided on the support. A hydrophilic graft chain and a group, which is able to react with a cross-linking agent, are introduced into the cross-linking hydrophilic layer.

Components of the planographic printing plate of the present invention will be explained in detail below.

Cross-linking Hydrophilic Layer

The cross-linking hydrophilic layer includes a hydrophilic graft polymer chain.

In the present invention, the hydrophilic layer, which is formed on the support denotes the hydrophilic layer comprising a hydrophilic graft polymer chain. The hydrophilic graft polymer chain bonds with a backbone high molecular compound. The high molecular compound having the hydrophilic graft polymer chain at a side chain thereof is coated or coated by cross-linking on the support. In the present invention, the cross-linking hydrophilic layer having a hydrophilic graft polymer introduced into a polymer cross-linking film structure is simply referred to as, "a cross-linking hydrophilic layer."

Preparation for Cross-linking Hydrophilic Layer

The cross-linking hydrophilic layer of the present invention can be prepared by producing the graft polymer in a conventional method, and then cross-linking the graft polymer. Synthesis of the graft polymer is specifically explained in Ide Fumio, "Gurafuto-jugo to sono Oyo (Graft Polymerization and Application Thereof)" Kobunshi Kankoukai, 1977, Koubunshi Gakkai.ed, "Shin Koubunshi Jikkengaku 2, Koubunshi no Gousei/Hanno (New Polymer Experiments 2, Preparation and Reaction of Polymers)" Kyoritsu Shuppan, 1995.

A graft polymer can be synthesized basically by one of the following three methods: 1. polymerizing branch monomers from a backbone polymer; 2. bonding a branch polymer with the backbone polymer; and 3. copolymerizing the backbone polymer and the branch polymer ("macromer method").

Any of the three methods can be employed to produce a hydrophilic surface of the present invention. However, the macromer method is particularly preferable from the viewpoint of productivity and control of the film structure.

Synthesis of the graft polymer using a macromer is explained in the aforementioned "Shin Koubunshi Jikkengaku 2, Koubunshi no Gousei/Hanno (New Polymer Experiments 2, Preparation and Reaction of Polymers)." Further, Yu Yamashita et. al., "Makuro-monomaa no Kagaku to Kogyo (The Chemistry and Industry of Macromonomers)" IPC, 1989 also describes in detail the preparation of the graft polymer. Specifically, a hydrophilic macromer, such as acrylic acid, acrylamide, 2-acrylamide-2-methylpropane sulfonic acid and N-vinylacetoamide, can be prepared in accordance with the methods described in the above-described publications, by using hydrophilic monomers listed below as an organic cross-linking hydrophilic layer.

Hydrophilic Monomer

Examples of hydrophilic monomers that are useful to form a hydrophilic graft polymer chain include: monomers, which are positively charged, such as ammonium and phosphonium; or monomers which are negatively charged, or which include an acidic group that can dissociate to be negatively charged, such as sulfonic acid groups, carboxyl groups, phosphoric acid groups, or phosphon acid groups. Other hydrophilic monomers, including a nonionic group, such as hydroxyl groups, amide groups, sulfonamide groups, alkoxy groups, or cyano groups, can also be used. Examples of the hydrophilic monomers which are particularly useful in the present invention include the following: carboxyl groups, sulfonic acid groups, phosphoric acid groups, amino groups or salts thereof, such as (meth)acrylic acids or alkali metal salts or amine salts thereof, itaconic acids or alkali metal salts or amine salts thereof, aryl amine or halogen hydroacid salts thereof, 3-vinylpropionic acids or alkali metal salts or amine salts thereof, vinylsulfonic acids or alkali metal salts or amine salts thereof, vinylstyrene sulfonic acids or alkali metal salts or amine salts thereof, 2-sulfoethlene (meth)acrylates, 3-sulfopropylene (meth) acrylates or alkali metal salts or amine salts thereof, 2-acrylamide-2-methyl propane sulfonic acids or alkali metal salts or amine salts thereof, acid phosphooxy polyoxyethyleneglycol mono (meth)acrylates, or arylamines or halogen hydroacid salts thereof, and carboxyl groups, sulfonic acid groups, phosphoric acid groups, amino groups or salts thereof, such as 2-trimethylaminoethyl (meth)acrylates or halogen hydroacid salts thereof. Further, 2-hydroxyethyl (meth)acrylates, (meth)acrylamides, N-monomethylol (meth)acrylamides, N-dimethylol (meth) acrylamides, N-vinylpyrolidones, N-vinylacetamides, arylamines or halogen hydroacid salts thereof, polyoxyethylene glycol mono (meth)acrylates are also useful.

Hydrophilic Macromer

Examples of hydrophilic macromers which are particularly useful in the present invention include the following: macromers derived from monomers, such as acrylic acids or methacrylic acids having carboxylic groups; sulfonic acid-based macromers derived from monomers, such as 2-acrylamide-2-methylpropanesulfonic acids, vinylstyrene sulfonic acids, or salts thereof; amide-based macromers, such as acrylamides or methacrylamides; amide-based macromers derived from N-vinylcarboxylic acid amide monomers, such as N-vinylacetamides or N-vinylformamides; macromers derived from monomers having hydroxyl groups, such as hydroxyethyl methacrylates, hydroxyethyl acrylates or glycerol monomethacylates; and macromers derived from monomers having alkoxy groups or ethyleneoxide groups, such as methoxyethyl acrylates, methoxypolyethylene glycol acrylates, or polyethylene glycol acrylates. Further, monomers having polyethylene glycol chains or polypropylene glycol chains are also useful as macromers in the present invention.

A useful molecular weight of these macromers is 400 to 100,000, preferably 1,000 to 50,000 and more preferably 1,500 to 20,000. The molecular weight of less than 400 is not preferable in view of the effects and the molecular weight of more than 100,000 is also not preferable in view of polymerizability with a copolymer monomer which forms a main chain.

One method of producing a cross-linking hydrophilic layer into which a hydrophilic graft chain is introduced is, after synthesis of the hydrophilic macromers, copolymerizing the hydrophilic macromer and another monomer having a reactive functional group to synthesize a graft copolymerized polymer. Then, coating the synthesized graft copolymerized polymer and the cross-linking agent, which is able to react with the reactive functional group of the polymer, on the support to cause the reaction and the cross-linking therebetween using heat. Alternatively, the cross-linking hydrophilic layer can be prepared by synthesizing a hydrophilic macromer and a graft polymer having a photocross-linkable group or a polymerizable group, and coating the synthesis on the support, then, irradiating light to cause the reaction and the cross-linking therebetween.

The planographic printing plate precursor of the present invention can be generally produced by dissolving components of the cross-linking hydrophilic layer in a solvent, and coating the resultant solution on a suitable support, and cross-linking.

Examples of the solvent include, but are not limited to, ethylenedichlorides, cyclohexanones, methylethytlketones, methanols, ethanols, propanols, ethylene glycol monomethylethers, 1-methoxy-2-propanols, 2-methoxyethylacetates, 1-methoxy-2-propylacetates, dimethoxyethanes, methyl lactates, ethyl lactates, N,N-dimethylacetamides, N,N-dimethylformamides, tetramethylureas, N-methylpyrrolidones, dimethylsulfoxides, sulfolanes, γ-butyllactones, toluenes, water and the like. These solvents may be used alone, or two or more types may be used in combination. The concentration of the aforementioned components in a solvent (the total solid contents including additives) is preferably 1 to 50% by weight.

Various methods can be employed to coat the solution on the support. Examples thereof include bar coater coating, rotation coating, spray coating, curtain coating, dip coating, air knife coating, blade coating and roll coating.

The thickness of the cross-linking hydrophilic layer can be selected in accordance with purposes thereof. Generally, a dry amount of the cross-linking hydrophilic layer is 0.5 to 5.0 $g/m^2$ and preferably 1.0 to 3.0 $g/m^2$. An amount of less than 0.5 $g/m^2$ is not preferable because it becomes difficult to achieve effects of the hydrophilic property, and an amount of more than 5.0 $g/m^2$ is also not preferable because sensitivity and film strength tend to decrease.

To improve coating properties, surfactants may be added to the cross-linking hydrophilic coating solution. Examples of the surfactants include a fluorine-based surfactant described in JP-A No. 62-170950. An amount of the surfactants to be added is preferably 0.01 to 1% by weight and more preferably 0.05 to 0.5% by weight based on the total solid content of the cross-linking hydrophilic layer.

Image Forming Layer

A preferable embodiment of the planographic printing plate of the present invention comprises a support, a cross-linking hydrophilic layer and an image forming layer (i.e., a recording layer which is photosensitive or heat-sensitive) which are laminated on the support in that order. A hydrophilic graft chain and a group that is able to react with a cross-linking agent are introduced into the cross-linked hydrophilic layer.

In the present invention, "laminate in that order" means that the specified layers are disposed on the support in the specified order, but does not exclude other layers, such as an overcoat layer, a primer layer, an intermediate layer, and a backcoat layer, for example, from being provided, so long as the other layers do not inhibit the effects of the present invention.

An image forming layer having a high molecular compound that includes a functional group the polarity of which changes from one of hydrophilic and hydrophobic to the other due to acid, heat, or exposure to radiation is preferably used in the present invention. In addition, a conventional PS-plate and a positive- or negative-type photosensitive image forming layer, which is known in the art of photo-resisting may also be used.

Here, a high molecular compound having a polarity exchanging group will be explained. The high molecular compound is a main component of the image forming layer, which is preferable in the present invention. The polarity exchanging group, which is to be introduced into the high molecular compound used in the image forming layer, includes two types of functional groups: a functional group whose polarity changes from hydrophobic to hydrophilic; and a functional group whose polarity changes from hydrophilic to hydrophobic.

High Molecular Compound, Which Has a Functional Group at a Side Chain and Polarity of Which Changes from Hydrophobic to Hydrophilic Among polymers having a polarity exchanging group at a side chain thereof, examples of polymers which have a functional group at the side chain thereof and whose polarity changes from hydrophobic to hydrophilic include sulfonic acid ester polymers and sulfonamides described in JP-A No. 10-282672, and carbonic acid ester polymers described in EP 0652483, JP-A Nos. 6-502260 and 7-186562.

Among these polymers, secondary sulfonic acid ester polymer, tertiary carbonic acid ester polymer and carbonic acid alkoxy alkyl ester polymer are particularly preferable.

Examples of the sulfonic acid ester polymer and carbonic acid ester polymer are represented by, but are not limited to, the following formulae. Compounds (1p-1) to (1p-8) are sulfonic acid ester polymers, and compounds (a1) to (a10) are carbonic acid ester polymers.

(1p-1)

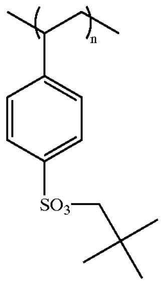

(1p-2)

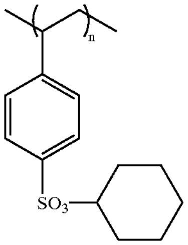

(1p-3)

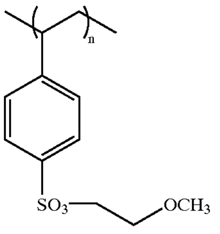

-continued (1p-4)

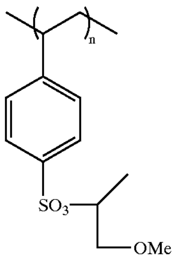

(1p-5)

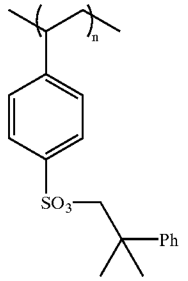

(1p-6)

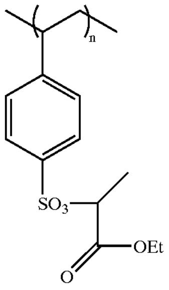

(1p-7)

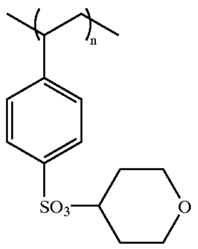

(1p-8)

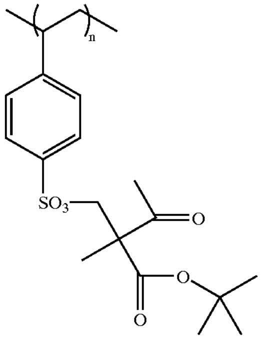

(al)

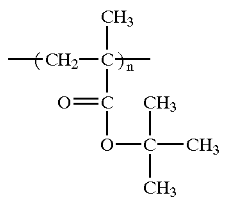

-continued (a2)

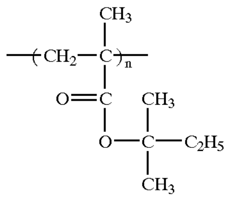

(a3)

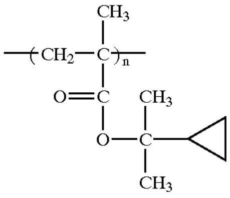

(a4)

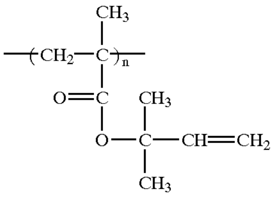

(a5)

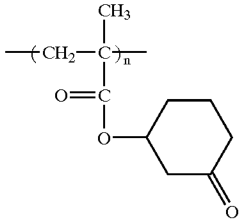

(a6)

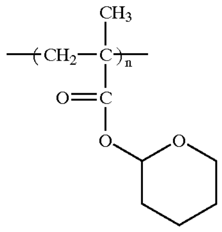

(a7)

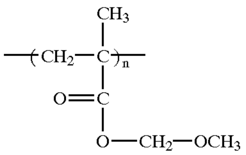

(a8)

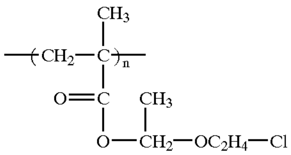

(a9)

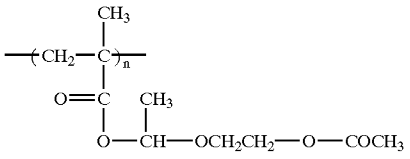

-continued (a10)

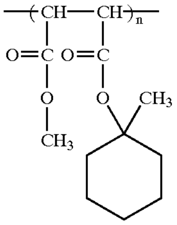

In the present invention, when these sulfonic acid ester polymers or carbonic acid ester polymers are used, the amount thereof is 5 to 99% by weight, preferably 10 to 98% by weight, and more preferably 30 to 90% by weight, based on the total solid content of the image forming layer.

High Molecular Compound, Which Has a Functional Group at a Side Chain and Polarity of Which Changes from Hydrophilic to Hydrophobic Examples of polymers, which have a functional group at the side chain thereof and whose polarity changes from hydrophilic to hydrophobic, include polymers having ammonium salt groups, described in JP-A No. 6-317899, and polymers, which have decarboxylated polarity exchanging groups, such as sulfonyl acetic acids, represented by the following general formula (1):

General Formula (1):

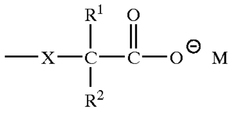

(wherein x represents —O—, —S—, —Se—, —$NR^3$—, —CO—, —SO—, —$SO_2$—, —PO—, —$SiR^3R^4$—, and —CS—; $R^1$, $R^2$, $R^3$ and $R^4$ each represents a monatomic group; and M represents an ion which is positively charged.)

Examples of $R^1$, $R^2$, $R^3$ and $R^4$ include —F, —Cl, —Br, —I, —CN, —$R^5$, —$OR^5$, —$OCOR^5$, —$OCOOR^5$, —$OCONR^5R^6$, —$OSO_2R^5$, —$COR^5$, —$COOR^5$, —$CONR^5R^6$, —$NR^5R^6$, —$NR^5R^6$, —$NR^5$—$COR^6$, —$NR^5$—$COOR^6$, —$NR^5$—$CONR^6R^7$, —$SR^5$, —$SOR^5$, —$SO_2R^5$, and —$SO_3R^5$.

Examples of $R^5$, $R^6$ and $R^7$ include hydrogen, alkyl groups, aryl groups, alkenyl groups and alkinyl groups. Examples of these functional groups include the functional groups listed above.

Among these, hydrogen, alkyl groups, aryl groups, alkenyl groups and alkinyl groups are preferably used as $R^1$, $R^2$, $R^3$ and $R^4$.

The polarity exchanging high molecular compound of the present invention may be a single monomer having a hydrophilic functional group listed above, or may be a copolymer of two or more of these monomers. Alternatively, a copolymer of the monomer having one of the hydrophilic functional groups listed above and other monomers may also be used as long as the effects of the present invention are achieved.

Examples of the high molecular compound having a functional group, at the side chain thereof, whose polarity changes from hydrophilic to hydrophobic (compounds (P-1) to (P-17)) are represented by, but are not limited to, the following formulae.

P-1
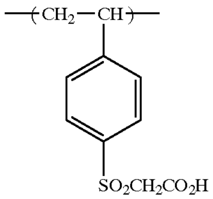
P-2
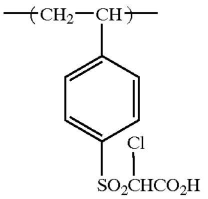
P-3
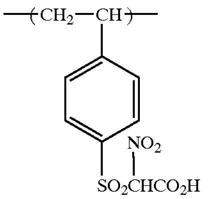
P-4
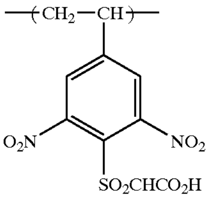
P-5
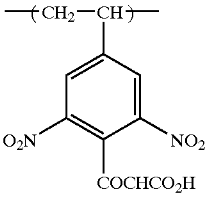
P-6
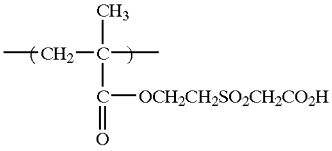
P-7
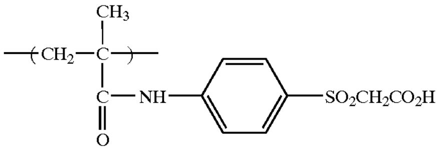
P-8
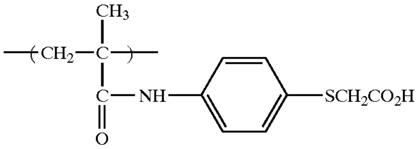
-continued
P-9
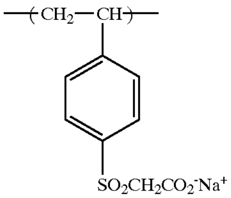
P-10
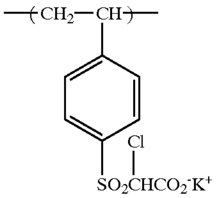
P-11
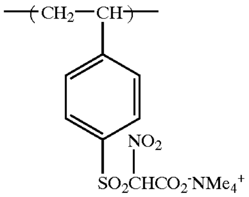
P-12
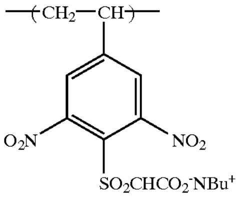
P-13
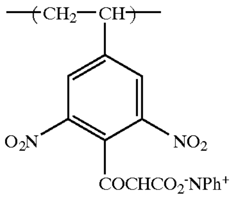
P-14
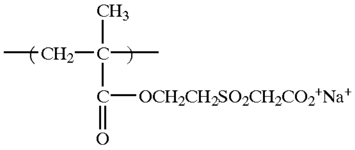
P-15
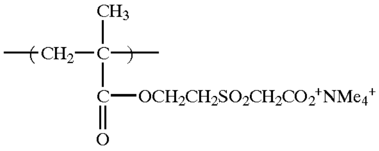
P-16
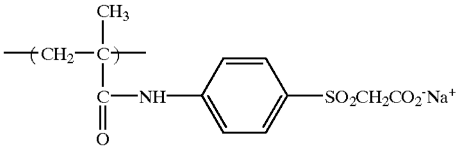

-continued

P-17

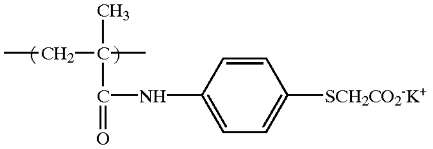

The amount of the polarity exchanging high molecular compound to be present in the image forming layer of the planographic printing plate of the present invention is preferably 0.01 to 94% by weight and more preferably 0.05 to 90% by weight based on the total solid content of the image forming layer.

In the present invention, image forming layers having various known image forming mechanisms can be employed instead of the polarity exchanging image forming layer. Components used in these conventional image forming layers will be explained below.

Positive Photosensitive Layer Composition

In the present invention, the following known positive photosensitive layer compositions (a) and (b) are preferably used:

(a) a conventional positive photosensitive composition, that includes a naphthoquinonediazide and a novolak resin; and (b) a chemically amplifying positive photosensitive composition, which includes a combination of an alkali-soluble compound protected by an acid decomposable group and an acid-generating agent.

Compositions (a) and (b) are well known in the art, and are preferably used in combination with the positive following positive photosensitive compositions (c) to (f).

(c) A laser sensitive positive composition, which is described in Japanese Patent Application No. 9-26878, and having a sulfonic acid ester polymer and an infrared ray absorber, which can make a planographic printing plate that does not require developing;

(d) A laser sensitive positive composition, which is described in EP 652483 or JP-A No. 6-502260, and having a carbonic acid ester polymer and an acid-generator or an infrared ray absorber, which can make a planographic printing plate that does not require developing;

(e) A laser sensitive positive composition, which is described in JP-A No. 11-95421, and having an alkali-soluble compound, and a substance which is heat-decomposable and substantially lowers the solubility of the alkali-soluble compound while the substance is not decomposed; and (f) A positive composition which is eluted when developed with alkali, the positive composition having an infrared ray absorber, a novolak resin and a dissolution suppressing agent, which can be used to make an alkali-development eluting type positive planographic printing plate.

Negative Photosensitive Layer Composition

In the present invention, known negative sensitive compositions (g) to (j) may be used.

(g) A negative composition, which is described in JP-A No. 59-101651, and includes a polymer having a photocross-linkable group and an azide compound;

(h) A negative composition having a diazo compound;

(i) A negative photopolymerizable photosensitive composition, which is described in U.S. Pat. No. 262276 or JP-A 2-63054, and includes a photopolymerizing initiator and an additional polymerizable unsaturated compound; and (j) A negative composition, which includes an alkali-soluble compound, an acid generating agent, and an acid cross-linkable compound.

Other Components

To obtain various characteristics, other components may be added to the image forming layer of the photographic printing plate precursor of the present invention.

A dye having high absorption in the visible light region may be added to the image forming layer of the planographic printing plate precursor of the present invention as a colorant for the image.

Examples of the dyes include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Co. Ltd.), Victoria Pure Blue, Crystal Violet (CI42555), Methyl Violet (CI42535), Ethyl Violet, Rhodamin B (CI145170B), Marakite Green (CI42000), Methylene Blue (CI52015), and dyes, which are described in JP-A No. 62-293247.

It is preferable to add these dyes because, with these dyes, an image portion and a non-image portion become easily distinguishable from each other after image formation. An added amount of the dye is 0.01 to 10% by weight based on the total solid content of the image forming layer.

A nonionic surfactant described in JP-A Nos. 62-251740 and 3-208514, and an amphoteric surfactant described in JP-A Nos. 59-121044 and 4-13149 may be added to the image forming layer of the present invention to improve a stability thereof in treatment for development.

Examples of the nonionic surfactant include sorbitan tristearates, sorbitan monopalmitates, sorbitan triolates, monoglyceride stearates, and polyoxyethylene nonylphenylethers.

Examples of the amphoteric surfactant include alkyl di(aminoethyl) glycines, alkyl polyaminoethyl glycine hydrochlorides, 2-alkyl-N-carboxyethyl-N-hydroxyethyl imidazolinium betains, and N-tetradecyl-N,N-betain type surfactants (for example, AMORGEN K, manufactured by DAIICHI INDUSTRIAL CO., LTD.). The amount of the nonionic and amphoteric surfactants in the image forming layer is preferably 0.05 to 15% by weight, and more preferably 0.1 to 5% by weight of the image forming layer of the planographic printing plate precursor.

In addition, if necessary, a plasticizer may be added to the image forming layer of the planographic printing plate precursor of the present invention to impart flexibility to the coated film. Examples of the plasticizer include butylphthalyls, polyethylene glycols, toributyl citrates, diethyl phthalates, dibutyl phthalates, dihexyl phthalates, dioctyl phthalates, tricresyl phosphates, triburyl phosphates, trioctyl phosphates, tetrahydrofurfuryl oleates, and oligomers and polymers of acrylic acid or methacrylic acid.

Other additives, such as known onium salts, haloalkyl-substituted s-triazines, epoxy compounds, vinylether groups, phenol compounds having a hydroxymethyl group described in Japanese Patent Application No. 7-18120, and phenol compounds having an alkoxymethyl group may also be added to the image forming layer.

In the present invention, the image forming layer is generally formed by dissolving the foregoing ordinary components in a solvent and then applying the solution on the cross-linking hydrophilic layer. Examples of the solvent include, but are not limited to, ethylenedichlorides, cyclohexanones, methylethytlketones, methanols, ethanols, propanols, ethylene glycol monomethylethers, 1-methoxy-2-propanols, 2-methoxyethylacetates, 1-methoxy-2-propylacetates, dimethoxyethanes, methyl lactates, ethyl lactates, N,N-dimethylacetamides, N,N-dimethylformamides, tetramethylureas, N-methylpyrrolidones, dimethylsulfoxides, sulfolanes, γ-butyllactones, toluenes and water. These solvents may be used alone, or two or more types may be used in combination. The concentration of the aforementioned components in a solvent (the total solid content including additives) is preferably 1 to 50% by weight.

The dry amount (the solid content) of the coated image forming layer can be selected in accordance with purposes thereof. Generally, the coated amount of the image forming layer is 0.1 to 10 g/$m^2$ and preferably 0.5 to 5 g/$m^2$. As the coated amount decreases, the sensitivity improves. However, when the coated amount becomes too small, the ability to withstand repeated printing deteriorates. On the other hand, as the coated amount increases, the film performance improves. However, when the applied amount becomes too large, the sensitivity becomes insufficient and the reproducibility of fine lines decreases.

A variety of methods can be employed to coat the image forming layer. Examples thereof include bar coater coating, rotation coating, spray coating, curtain coating, dip coating, air knife coating, blade coating, roll coating and the like.

To improve coating characteristics, surfactants may be added to the image forming layer of the planographic printing plate precursor of the present invention. Examples of the surfactants include fluorine-based surfactants described in JP-A No. 62-170950. An amount of the surfactants to be added is preferably 0.01 to 1% by weight and more preferably 0.05 to 0.5% by weight based on the total solid content of the image forming layer.

Compounds That Form a Surface Hydrophobic Region when Exposed to Heat or Radiation A preferable embodiment of the present invention comprises, a support, a cross-linking hydrophilic layer on the support, into which cross-linking hydrophilic layer a group that is able to react with the cross-linking agent and a hydrophilic graft chain are introduced, and a compound, such as heat-fusible hydrophobic particles or the like, that is able to form a hydrophobic surface region. In this embodiment, the cross-linking hydrophilic layer itself has an image forming function.

Examples of the compound, which is added to the cross-linking hydrophilic layer, and has the function of image forming, i.e., compounds which are able to form a hydrophobic area when exposed to heat or radiation, include compounds whose polarity may be changed from hydrophilic to hydrophobic when exposed to heat or radiation, or heat-fusing hydrophobic particles.

An example of the compound whose polarity may be changed from hydrophilic to hydrophobic include polymers having a functional group whose polarity changes from hydrophilic to hydrophobic as a result of decarboxylation when heated, described in JP-A No. 2000-122272 (Application No. 10-229783). Specifically, high molecular compounds, which are represented by, but are not limited to, the following formulae are preferable. These compounds may preferably have physical properties in that, when coated, the contact angle of water droplets in the air on the film surface is 20° or less before being heated, and is 65° or more after being heated.

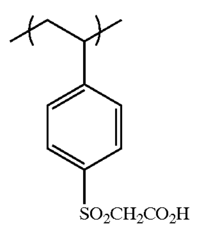

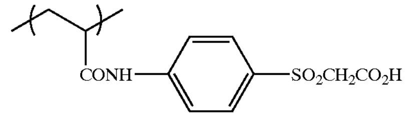

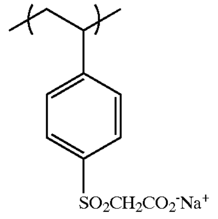

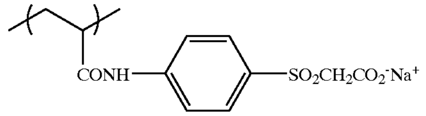

Examples of the heat-fusing hydrophobic particle may include polystyrenes described in EP 816070. Hydrophobic particles encapsulated in micro-capsules described in WO 94/23954 may also be used for the same purpose.

In the present invention, the heat-fusing hydrophobic particles, which are included in the cross-linking hydrophilic layer as an image forming component, fuse to and coalesce with each other due to heat generated by heating or by irradiation with an infrared laser, to form a hydrophobic area (an ink receiving area: the image portion). The particles are formed by hydrophobic organic compounds.

The melting point (fusing point) of the hydrophobic organic compound is preferably 50 to 200° C. from the viewpoint of quick fusing of the particles due to a predetermined amount of heat. When the fusing point of the heat-fusing hydrophobic particles is less than 50° C., there arises a problem that the particles may become soft or fuse due to the effects of heat during drying of the film, or the like, in the manufacturing process, or due to the effects of a temperature of the environment during storage. The fusing point is preferably 80° C. or more, and more preferably 100° C. or more from the viewpoint of stability over time. As the fusing point become greater, the stability increases. However, it is preferable that the fusing point does not exceed 200° C. from the viewpoint of recording sensitivity and ease of handling.

Examples of the hydrophobic organic compound, which forms the heat-fusing hydrophobic particle, include resins, such as polystyrenes, polyvinyl chlorides, polymethyl methacrylates, polyvinylidene chlorides, polyacrylonitriles, polyvinyl carbazoles, and copolymers and mixtures thereof. Further, paraffin waxes, microwaxes, polyolefine waxes, such as polyethylene waxes and polypropylene waxes, fatty acid waxes, such as stearoamides, linolenamides, laurylamides, myristylamides, palmitamides and amide oleates, higher fatty acids such as stearic acids, tridecane acids and palmitic acids are also preferably used.

The heat-fusing hydrophobic particles, which easily fuse to and coalesce with each other due to heat, may be preferably used in the cross-linked hydrophilic layer in the present invention from the viewpoint of image forming property. Further, the heat-fusing hydrophobic particles whose surfaces are hydrophilic and are easily dispersed in water are particularly preferable from the viewpoint of preventing deterioration of the hydrophilic property.

Regarding hydrophilic property of the surface of the heat-fusing hydrophobic particle, it is preferable that the contact angle (with water droplets in the air) of the film, which is coated only with the heat-fusing hydrophobic particles and is dried at a lower temperature than the solidification temperature, be smaller than the contact angle (droplet in the air) of the film, which is coated only with the heat-fusing hydrophobic particles and is dried at a higher temperature than the solidification temperature. To provide this preferable hydrophilic property on the surface of the heat-fusing hydrophobic particle, hydrophilic polymers or oligomers, such as polyvinyl alcohols and polyethylene glycols, or hydrophilic low molecular compounds may be absorbed on the surface of the heat-fusing hydrophobic particle. However, the method for making the particle surface hydrophilic is not limited to these, and various known methods may be employed to make the surface hydrophilic.

The average particle diameter of the heat-fusing hydrophobic particle is preferably 0.01 to 20 μm, more preferably 0.05 to 2.0 μm, and the most preferably 0.1 to 1.0 μm. When the average particle diameter is over 20 μm, the resolution may be lowered. When the average particle diameter is less than 0.01 μm, the stability over time may become worse.

The amount of the heat-fusing hydrophobic particle to be added is preferably 30 to 98% by weight and more preferably 40 to 95% by weight.

Support

It is preferable that a support used in the present invention is a dimensionally-stable plate-like substance. Any material may be used for the support as long as the material has a necessary strength, durability, flexibility, and the like. Namely, paper, paper laminated with plastic (e.g., polyethylenes, polypropylenes, and polystyrenes), metal plates (e.g., aluminum, zinc, and copper), plastic films (e.g., cellulose diacetates, cellulose triacetates, cellulose propionates, cellulose butyrates, cellulose acetates/butyrates, cellulose nitrates, polyethylene terephthalates, polyethylenes, polystyrenes, polypropylenes, polycarbonates, and polyvinyl acetals), and paper or plastic film with the above-described metals laminated or deposited thereon are preferably used.

A polyester film or an aluminum plate is preferably used as a support in the present invention. An aluminum plate is particularly preferable since it has good dimensional-stability and can be provided at a relatively low cost.

Examples of preferable aluminum plates may include pure aluminum plates and alloy plates comprising aluminum as the main component and trace qualities of different elements. Furthermore, plastic films on which aluminum is laminated or deposited can also be used. Examples of different elements included in an aluminum alloy include silicon, iron, manganese, copper, magnesium, chrome, zinc, bismuth, nickel, and titanium. An amount of the different elements in the alloy is preferably 10% by weight or less. In the present invention, pure aluminum is particularly preferable. However, since production of a completely pure aluminum is difficult in terms of refining technology, one containing trace qualities of a different element can be used. The composition of an aluminum plate applied in the present invention as mentioned above is not specifically defined, and a known aluminum plate can be also used. The thickness of an aluminum plate used in the present invention is 0.1 to 0.6 mm, preferably 0.15 to 0.4 mm, and more preferably 0.2 to 0.3 mm.

Light-to-Heat Converting Substance

In a case in which an image is formed on the planographic printing plate precursor of the present invention using an infrared ray laser, it is preferable that a light-to-heat converting substance, which changes light energy to heat energy, be included somewhere in the planographic printing plate precursor. The light-to-heat converting substance may be included in, for example, the image forming layer, the cross-linking hydrophilic layer, the surface layer of the support, or the support. Alternatively, the light-to-heat converting substance may be included in a thin layer, which is provided between the image forming layer and the cross-linking hydrophilic layer, or between the surface layer of the support and the support.

Any light-to-heat converting substance may be used in the planographic printing plate precursor of the present invention as long as the substance absorbs ultraviolet rays, visible light, infrared rays, white light or the like, and converts this into heat. Namely, carbon blacks, carbon graphites, pigments, phthalocyanine-based pigments, iron powders, graphite powders, iron oxide powders, lead oxides, silver oxides, chromium oxides, iron sulfides, chromium sulfides and the like, are preferably. used. A dye, pigment or metal which effectively absorbs infrared rays having a wavelength of 760 nm to 1,200 nm, is particularly preferable.

As dyes, known dyes commercially available or those disclosed in references (e.g., Yuki Gosei Kagaku Kyokai (Organic Synthetic Chemistry Association) ed. "Senryo Binran (Dye Handbook)," 1970, can be used. Namely, azo dyes, metal complex azo dyes, pyrazolone azo dyes, anthraquinone dyes, phthalocyanine dyes, carbonium dyes, quinoneimine dyes, methyne dyes, cyanine dyes, and metal thiolate complexes are preferably used. Examples of preferable dyes may include cyanine dyes disclosed in JP-A Nos. 58-125246, 59-84356, 59-202829, and 60-78787; methyne dyes disclosed in JP-A Nos. 58-173696, 58-181690, and 58-194595; naphthoquinone dyes disclosed in JP-A Nos. 58-112793, 58-224793, 59-48187, 59-73996, 60-52940, and 60-63744; squalilium dyes disclosed in JP-A No. 58-112792; and cyanine dyes disclosed in U.K. Patent No. 434,875.

As a near infrared absorption sensitizer, one disclosed in U.S. Pat. No. 5,156,938 is preferably used. Further, substituted aryl benzo(thio)pyrylium salts disclosed in U.S. Pat. No. 3,881,924; trimethyne thiapyrylium salts disclosed in JP-A No. 57-142645 (U.S. Pat. No. 4,327,169); pyrylium-based compounds disclosed in JP-A Nos. 58-181051, 58-220143, 59-41363, 59-84248, 59-84249, 59-146063, and 59-146061; cyanine dyes disclosed in JP-A No. 59-216146; pentamethyne thiopyrylium salts disclosed in U.S. Pat. No. 4,283,475; and pyrylium compounds disclosed in JP-B Nos. 5-13514 and 5-19702 can be preferably used as well. Examples of other preferable dyes include near infrared absorption dyes disclosed in U.S. Pat. No. 4,756,993 and represented by formulae (I) and (II). Among these dyes, cyanine dyes, squalilium dyes, pyrylium salts, and nickel thiolate complexes are particularly preferable.

Pigments usable in the present invention may include commercially available pigments and those disclosed in Nippon Ganryo Gijutsu Kyokai (Japan Pigment Technology Association).ed, Color Index (C. I.) Manual, "Saishin Ganryo Binran (Current Pigment Manual)," 1977; "Saishin Ganryo Oyo Gijutsu (Current Pigment Application Technology)," CMC Press, 1986; and "Insatsu Inki Gijutsu (Printing Ink Technology)," CMC Press, 1984. Examples of pigments include black pigments, yellow pigments, orange pigments, brown pigments, red pigments, purple pigments, blue pigments, green pigments, fluorescent pigments, metal powder pigments, and polymer bond pigments. Namely, insoluble azo pigments, azo lake pigments, condensation azo pigments, chelate azo pigment, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon blacks can be used. Among these, carbon blacks are preferable.

These pigments can be used without surface treatment, or can be used after a surface treatment is applied. Examples of surface treatment methods include surface coating with resins or waxes, adhering surfactants, and bonding reactive substances (e.g., a silane coupling agent, an epoxy compound, and polyisocyanate) with the pigment surface. The above-mentioned surface treatment methods are disclosed in "Kinzokusekken no Seishitsu to Oyo (Properties and Applications of Metal Soaps)," Sachi Press; "Insatsu Inki Gijutsu (Printing Ink Technology)," CMC Press, 1984; and "Saishin Ganryo Oyo Gijutsu (Current Pigment Application Technology)," CMC Press, 1986.

The particle diameter of the pigment is preferably 0.01 to 10 μm, more preferably 0.05 to 1 μm, and most preferably 0.1 μm to 1 μm. When the particle diameter of the pigment is less than 0.01 μm, the stability of the pigment dispersion in a coating solution containing the light-to-heat converting substance may become worse. On the other hand, when the particle diameter of the pigment exceeds 10 μm, the uniformity of a layer containing the light-to-heat converting substance may be adversely affected. As methods of dispersing a pigment, known dispersing methods employed in preparing inks or toners can be used. Examples of dispersing machines include ultrasonic dispersing machines, sand mills, attritors, pearl mills, super mills, ball mills, impellers, dispersers, KD mills, colloid mills, dynatrons, triple roll mills, and pressure kneaders. Details thereof are described in "Saishin Ganryo Oyo Gijutsu (Current Pigment Application Technology)," CMC Press, 1986.

An added amount of the dye or pigment is 0.01 to 50% by weight, preferably 0.1 to 10% by weight, and most preferably 0.5 to 10% by weight for a dye, 3.1 to 10% by weight for a pigment, based on the total solid content of the layer containing the light-to-heat converting substance. When the amount of the pigment or dye is less than 0.01% by weight, sensitivity becomes insufficient. When the amount of the pigment or dye is more than 50% by weight, the film strength of the layer containing the light-to-heat converting substance decreases.

EXAMPLES

The present invention will now be described in detail by way of Examples. However, the present invention is not limited to these Examples.

Synthesis of Polymer 1 of the Present Invention

Synthesis of Amide Macromonomer 30 g of acrylamide and 3.8 g of 3-mercapto propionic acid were dissolved in 70 g of ethanol and the resulting solution was heated to 60° C. in a nitrogen atmosphere. Then, 300 mg of 2,2-azobisisobutyronitrile (AIBN) was added as a thermal polymerization initiator and the solution was allowed to react for six hours. After the reaction, a white precipitate was filtered out, and washed well with methanol to obtain 30.8 g of terminal carbonic acid prepolymers (acid value: 0.787 meq/g, molecular weight: $1.29\times10^3$).

After 20 g of the obtained prepolymers were dissolved in 62 g of dimethyl sulfoxide, 6.71 g of glycidyl methacrylate, 504 mg of N,N-dimethyldodecylamine (catalyst), and 62.4 mg of hydroquinone (polymerization inhibitor) were added. The obtained solution was allowed to react for 7 hours at 140° C. in a nitrogen atmosphere. Acetone was added to the resultant solution to precipitate a polymer. The polymer was sufficiently washed to obtain 23.4 g of terminal methacrylate acrylamide macromonomer (weight average molecular weight: 1,400). It was confirmed that a polymerizable group was introduced into the terminal because $H^1$-NMR($D_2$0) 6.12, 5.70 ppm methacryloyl group olefin peak, and the acid value (0.057meq/g) decreased.

Synthesis of Graft Polymer (1) using Amide Macromonomer

A solution consisting of 17 g of distilled water into which 4 g of the above-prepared macromonomer, 6 g of sodium methacrylate, and 100 mg of 2,2-azobis[2-(2-imidazoline-2-yl)propane] (trade name: VA061, manufactured by Wako Pure Chemical Industries, Ltd.) were dissolved was added dropwise to 5 g of distilled water in a flask for 2 hours at 65° C. in an atmosphere of nitrogen.

After addition of solution was completed, the resultant solution was heated for another 6 hours. Acetone was added to the resultant solution to precipitate a polymer. The polymer was washed well to obtain 6.95 g of graft polymer (1) (weight average molecular weight: $130\times10^5$, yield: 92.7%).

Production of Support

After an aluminum plate having a thickness of 0.30 mm was degreased with trichloroethylene washing, its surface was made coarse using an aqueous suspension of 400 mesh pumice power by a nylon brush, rinsed well with water. After the aluminum plate was etched by immersion in a 25% by weight of sodium hydroxide aqueous solution at 45° C. for 9 seconds, the plate was rinsed with water, and further immersed in a 2% by weight of $HNO_3$ aqueous solution for 20 seconds and then rinsed with water. At this time, the amount of etching of the coarse surface was about 3 g/m$^2$.

Subsequently, 7% by weight sulfuric acid aqueous solution was used for an electrolyte solution. On an aluminum plate DC anodes, an electrode oxide coating film of 2.4 g/m$^2$ was provided at a current density of 15A/dm$^2$, rinsed with water, and dried to obtain a support.

Example 1

Planographic Printing Plate Precursor Having Positive-type Image Forming Layer

Cross-linking Hydrophilic Layer

A cross-linking hydrophilic layer coating solution 1 having the composition below was coated on the above-described aluminum support such that the dry amount of the coating solution was 2 g/m$^2$. Then the coating solution 1 was heated for 1 hour at 140° C. to obtain a cross-linking hydrophilic layer.

The composition of the cross-linking hydrophilic layer coating solution 1 was as follows.

| | |
|---|---|
| Graft polymer (1) (obtained in the above-described Synthesis of Polymer 1) | 1.0 g |
| Ethylene glycol diglycidyl ether | 0.2 g |
| Polyoxyethylene nonylphenylether (10% aqueous solution of Emargen 910 (trade name), manufactured by Kao Corporation) | 0.24 g |
| 1N hydrochloric acid aqueous solution | 8.2 g |
| Water | 11.6 g |

Image Forming Layer

An image forming layer coating solution 1 having the composition below was coated, using a rod bar #15, on the above-described cross-linking hydrophilic layer (1) such that the dry amount of the coating solution was 2.6 g/m$^2$. Then, the coating solution was dried for 55 minutes at 80° C. to form a positive-type image forming layer and obtain a planographic printing plate precursor A of Example 1.

The composition of the image forming layer coating solution 1, which is sulfonic acid ester-based, was as follows.

| | |
|---|---|
| Sulfonic acid ester polymer (Compound 1p-4) | 0.4 g |
| Infrared ray absorbing dye (trade name: IRG22, manufactured by NIPPON KAYAKU CO., LTD.) | 50 mg |
| Methyl ethyl ketone | 4.0 g |

Evaluation

The positive-type planographic printing plate precursor A thus obtained was exposed imagewise using a PEARL SETTER (trade name, manufactured by Presstek, exposing conditions: infrared ray laser of 908 nm; output power: 1.2w; and main scanning speed: 2 m/sec). The exposed printed plate was mounted on a printing machine (trade name: RYOBI 3200, manufactured by Ryobi Imagix Co. Limited) without being developed. Then, printing was started by using moistening water (trade name: IF201 (2.5%) and trade name: IF202 (0.75%), manufactured by Fuji Photo Film Co., Ltd.) and charcoal (trade name: GEOS-G, manufactured by Dainippon Inc & Chemicals, Inc.) as an ink. In the initial stage of printing, remaining portions of the image forming layer in non-image portions were removed and a printed matter of high quality was obtained. Subsequently, printing was continued. Even after 2,000 sheets of printed matter were obtained, no blemishes was found in non-image portions. Hence the planographic printing plate obtained from the printing plate precursor of the present invention had an excellent hydrophilic property and an excellent ability to withstand repeated printing.

Example 2

Heat-sensitive Planographic Printing Plate Precursor Having Negative-type Image Forming Layer Using the aluminum support on which the cross-linking hydrophilic layer is provided, a negative-type planographic printing plate precursor B was produced in the same manner as in Example 1, except that an image forming layer coating solution 2 having the composition below was used to form a negative-type image forming layer.

The composition of the image forming layer coating solution 2, which is sulfonyl acetic acid-based, was as follows.

| | |
|---|---|
| Sulfonyl acetic acid-based polymer (Compound p-1) | 0.4 g |
| Infrared ray absorbing dye (trade name: IRG22, manufactured by NIPPON KAYAKU CO., LTD.) | 50 mg |
| Methanol | 4.0 g |

Evaluation

The obtained negative-type planographic printing plate precursor B was exposed imagewise under the same conditions as in Example 1. The exposed printed plate was mounted on a printing machine (trade name: ROYBI 3200, manufactured by Ryobi Imagix Co. Limited) without being developed. Then, printing was initiated using moistening water (trade name: IF201 (2.5%) and trade name: IF202 (0.75%), manufactured by Fuji Photo Film Co., Ltd.) and charcoal (trade name: GEOS-G, manufactured by Dainippon Inc & Chemicals, Inc.) as an ink. A printed matter of high quality was obtained in the initial stage of printing. Subsequently, printing was continued. Even after 2,000 sheets of printed matter were obtained, printed matter of high quality with no blemishes were obtained. Hence, when the negative-type image forming layer was used, the planographic printing plate obtained from the printing plate precursor of the present invention had an excellent hydrophilic property and an excellent ability to withstand repeated printing.

Example 3

Heat-Sensitive Planographic Printing Plate Precursor Having Heat-Fusing Hydrophobic Particles in Cross-Linking Hydrophilic Layer On the aluminum support, a coating solution 3 having the composition below was coated such that the coated amount was 2 g/m$^2$. The support was then heated and dried for 30 minutes at 100° C. to obtain a planographic printing plate precursor.

The composition of the cross-linking hydrophilic layer coating solution was as follows.

| | |
|---|---|
| Graft polymer (1) (obtained in the Synthesis example 1) | 1.0 g |
| Ethylene glycol diglycidyl ether | 0.2 g |
| Light-to-heat converting agent A (having a structure below) | 0.28 g |
| Dispersion comprising 20% by weight of heat-fusing polystyrene particles dispersed in water, which dispersion is stabilized with a surfactant (1.5% by weight relative to the particles) (particle diameter: 0.2 μm, fusing point: 120° C.) | 6.15 g |
| Polyoxyethylene nonylphenylether (10% aqueous solution of Emargen 910 (trade name), manufactured by Kao Corporation) | 0.24 g |
| 1N hydrochloric acid aqueous solution | 8.2 g |
| Water | 11.6 g |

Light-to-heat converting agent A

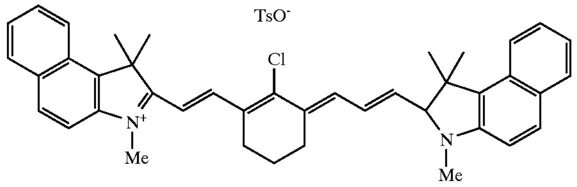

Evaluation

The obtained planographic printing plate precursor was image exposed at 1,751 dpi with a main scanning speed of 3 m/sec using a semiconductor laser having a wavelength of 830 nm and a beam diameter of 25 mm. The exposed printed plate was mounted on a printing machine (trade name: HEIDEL KOR-D) without being developed and printing was initiated. As a result, remaining portions of the image forming layer in non-image portions were removed and a printed matter of high quality was obtained in the initial stage of printing. Subsequently, printing was continued. As a result, over 3,000 sheets of high-quality printed matter having no blemishes on the non-image portion were obtained. Hence the planographic printing plate obtained from the printing plate precursor of the present invention had an excellent hydrophilic property and an excellent ability to withstand repeated printing.

The planographic printing plate precursor of the present invention has an excellent hydrophilic property which can be preserved under severe printing conditions, and an excellent ability to withstand repeated printing. Thus, with the planographic printing plate precursor of the present invention, many sheets of high-quality printed matters with no blemishes in non-image portions can be obtained. Further, when used with an image forming layer having a high molecular compound, which includes a polarity exchanging group, the planographic printing plate precursor of the present invention can be used to produce a plate by scan-exposure based on digital signals. Moreover, by adding heat-fusing hydrophobic particles and, if necessary, a light-to-heat converting substance, and the like, to the matrix of the cross-linking hydrophilic layer, a hydrophobic area is formed in the surface of the cross-linking hydrophilic layer when exposed to heat or radiation. Consequently, image formation by scan-exposure with laser light or the like can be carried out in a short time. Accordingly, an excellent on-machine developing ability has been achieved by the present invention because plates can be made with the planographic printing plate precursor of the present invention by simple developing treatment with water or by directly mounting on a printing machine without developing.

What is claimed is:

1. A planographic printing plate precursor comprising a support and a cross-linking hydrophilic layer disposed thereon, which cross-linking hydrophilic layer has a cross-linking structure and includes a hydrophilic high molecular compound having a hydrophilic graft chain, wherein the cross-linking hydrophilic layer is produced by reacting a hydrophilic high molecular compound having, on the backbone polymer thereof, a group which is able to react with a cross-linking agent, with the cross-linking agent.

2. A planographic printing plate precursor according to claim 1, wherein the cross-linking hydrophilic layer and an image forming layer are laminated on the support in that order.

3. A planographic printing plate precursor according to claim 2, wherein the image forming layer includes a high molecular compound, which has a polarity exchanging group at a side chain thereof, whose polarity changes from one of hydrophilic and hydrophobic to the other, by exposure to at least one of acid, heat and exposure to radiation.

4. A planographic printing plate precursor according to claim 3, wherein the high molecular compound, which has the polarity exchanging group, at the side chain thereof, has, at a side chain thereof, a functional group whose polarity changes from hydrophobic to hydrophilic.

5. A planographic printing plate precursor according to claim 4, wherein the high molecular compound which has the functional group, at the side chain thereof, whose polarity changes from hydrophobic to hydrophilic is selected from a group consisting of secondary sulfonic acid ester polymers, tertiary carbonic acid ester polymers and carbonic acid alkoxy alkyl ester polymers.

6. A planographic printing plate precursor according to claim 3, wherein the high molecular compound which has the polarity exchanging group, at the side chain thereof, has, at a side chain thereof, a functional group whose polarity changes from hydrophilic to hydrophobic.

7. A planographic printing plate precursor according to claim 6, wherein the high molecular compound which has the functional group, at the side chain thereof, whose polarity changes from hydrophilic to hydrophobic, has a decarboxylated polarity exchanging group represented by the following general formula (1):

General Formula (1):

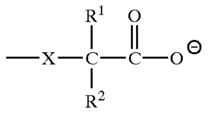

wherein X represents —O—, —S—, —Se—, $—NR^3—$, —CO—, —SO—, $—SO_2—$, —PO—, $—SiR^3R^4—$, and —CS—; $R^1$, $R^2$, $R^3$ and $R^4$ each represent a monatomic group; and M represents an ion which is positively charged.

8. A planographic printing plate precursor according to claim 1, wherein the cross-linking hydrophilic layer includes a compound that is able to form a hydrophobic area on a surface of the cross-linking hydrophilic layer when exposed to heat or radiation.

9. A planographic printing plate precursor according to claim 8, wherein physical properties of the compound, which is able to form a hydrophobic area on a surface of the cross-linking hydrophilic layer when exposed to heat or radiation, change from hydrophilic to hydrophobic.

10. A planographic printing plate precursor according to claim 9, wherein the compound, whose physical properties change from hydrophilic to hydrophobic when exposed to heat or radiation, is selected from a group consisting of compounds represented by the following formulae:

Compound (1)

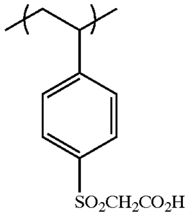

Compound (2)

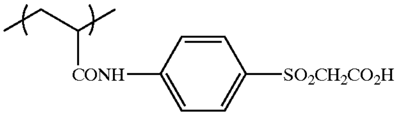

Compound (3)

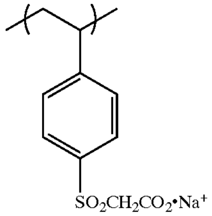

Compound (4)

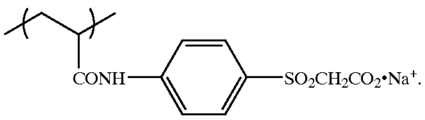

11. A planographic printing plate precursor according to claim 3, wherein the compound, which can form a hydrophobic area on a surface of the cross-linking hydrophilic layer when exposed to heat or radiation, is a hydrophobic organic compound formed as heat-fusing hydrophobic particles, wherein the heat-fusing hydrophobic particles fuse to and coalesce with each other due to heat generated by irradiation of an infrared laser, and form a hydrophobic area.

12. A planographic printing plate precursor according to claim 11, wherein a fusing point of the hydrophobic organic compound, which forms the heat-fusing hydrophobic particles, is 50 to 200° C.

13. A piano graphic printing plate precursor according to claim 11, wherein the hydrophobic organic compound, which forms the heat-fusing hydrophobic particles, is selected from a group consisting of polystyrenes, polyvinyl chlorides, polymethyl methacrylates, polyvinylidene chlorides, polyacrylonitriles, polyvinyl carbazoles, copolymers and mixtures thereof, polyolefine waxes, fatty acid waxes, and higher fatty acid.

14. A planographic printing plate precursor according to claim 11, wherein an average particle diameter of the heat-fusing hydrophobic particles is 0.01 to 20 mm.

15. A planographic printing plate precursor according to claim 11, wherein an amount of the heat-fusing hydrophobic particle to be added is 30 to 98% by weight based on total solid content of the cross-linking hydrophilic layer.

16. A planographic printing plate precursor according to claim 1, wherein a dry amount of the cross-linking hydrophilic layer is 0.5 to 5.0 $g/m^2$.

* * * * *